(12) United States Patent
Polarouthu et al.

(10) Patent No.: US 10,256,779 B2
(45) Date of Patent: Apr. 9, 2019

(54) MULTI-LEVEL CLASS D AMPLIFIER

(71) Applicant: TEXAS INSTRUMENTS INCORPORATED, Dallas, TX (US)

(72) Inventors: Sudhir Polarouthu, Bengaluru (IN); Jasjot Singh Chadha, Bengaluru (IN); Rejin Raveendranath Kanjavalappil, Thrissur (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/730,410

(22) Filed: Oct. 11, 2017

(65) Prior Publication Data

US 2018/0175812 A1 Jun. 21, 2018

(30) Foreign Application Priority Data

Dec. 16, 2016 (IN) .............................. 201641042893

(51) Int. Cl.
*H03F 3/217* (2006.01)
*H03F 3/45* (2006.01)
*H03F 1/02* (2006.01)
*H03F 3/183* (2006.01)

(52) U.S. Cl.
CPC .......... *H03F 3/217* (2013.01); *H03F 1/0211* (2013.01); *H03F 3/183* (2013.01); *H03F 3/2173* (2013.01); *H03F 3/45* (2013.01); *H03F 1/02* (2013.01); *H03F 2200/03* (2013.01); *H03F 2200/351* (2013.01)

(58) Field of Classification Search
CPC ........... H03F 3/38; H03F 3/217; H03F 3/2171

USPC ....................................... 330/10, 207 A, 251
See application file for complete search history.

(56) References Cited

U.S. PATENT DOCUMENTS 9,793,867 B2 * 10/2017 Frith et al. .................... 330/251

OTHER PUBLICATIONS

Mikkel Hoyerby, Jorgen Kragh Jakobsen, Jesper Mitgaard, and Thomas Helm Hansen, "2×70 Monolithic Five-Level Class-D Audio Power Amplifier in 180 nm BCD." IEE Journal of Solid-State Circuits, 51(12), Dec. 2016, 2819-2829.
Chun Wei Lin, Bing Shiun Hsieh, Chih Wei Chung, "PWM-Based Multilevel Class-D Amplifier With Integrated Over-Current Protection System," 5th IEEE Conference on Industrial Electronics and Applications, 2010, pp. 1394-1398.
Ying Zhang, Ling Cai, Qing-De Meng, and Yao-hua Li. "A High-efficiency Cascade Multilevel Class-D Amplifier with Sliding Mode Control." 2008 IEEE Conference on Robotics, Automation and Mechatronics, Sep. 2008, pp. 1212-1216.

* cited by examiner

*Primary Examiner* — Steven J Mottola
(74) *Attorney, Agent, or Firm* — John R. Pessetto; Charles A. Brill; Frank D. Cimino (57) ABSTRACT

An amplifier includes a first transistor coupled to a first voltage source node and a second transistor coupled to a second voltage source node. The first and second transistors also couple together at an intermediate node. The amplifier further includes a third transistor coupled to the intermediate node and a fourth transistor coupled to the third transistor at a positive output node of the amplifier. Further, the amplifier includes a fifth transistor coupled to the intermediate node and a sixth transistor coupled to the fifth transistor at a negative output node of the amplifier.

16 Claims, 5 Drawing Sheets

MULTI-LEVEL CLASS D AMPLIFIER

RELATED APPLICATIONS

This application claims priority to Indian Provisional Application No. 201641042893, filed Dec. 16, 2016, which is hereby incorporated by reference.

BACKGROUND

In some amplifier applications a "class D" amplifier architecture is used. For example, a class D amplifier may be used in battery-powered audio applications. In some such systems, a multi-level class D amplifier coupled to a boost converter, which increases a voltage from a power supply, may be used to deliver higher power to a load (e.g., a speaker). In a multi-level class-D amplifier, the pulse width modulated output may switch between three levels. The three levels may be ground, a battery voltage, and a boost voltage. Some class D amplifier circuits may include control logic to switch the bulk connections of some of the transistors in the circuit, to achieve multi-level outputs, in an attempt to avoid forward biasing bulk diodes of the transistors, which might occur otherwise in certain conditions.

SUMMARY

In some embodiments, an amplifier includes a first transistor coupled to a first voltage source node and a second transistor coupled to a second voltage source node. The first and second transistors also couple together at an intermediate node. The amplifier further includes a third transistor coupled to the intermediate node and a fourth transistor coupled to the third transistor at a positive output node of the amplifier. Further, the amplifier includes a fifth transistor coupled to the intermediate node and a sixth transistor coupled to the fifth transistor at a negative output node of the amplifier.

In another embodiment, an amplifier includes a boost converter, a controller, and first, second, third, fourth, fifth and sixth transistors. The first transistor is coupled to a first voltage source node. The boost converter is configured to convert a first voltage from the first voltage source node to a higher second voltage of a second voltage source node. The second transistor is coupled to the second voltage source node. The first and second transistors also couple together at an intermediate node. The third transistor couples to the intermediate node. The fourth transistor couples to the third transistor at a positive output node of the amplifier. The fifth transistor couples to the intermediate node, and the sixth transistor is coupled to the fifth transistor at a negative output node of the amplifier. Responsive to a control signal indicative of an input signal to be amplified being lower than a threshold, the controller turns on the first transistor, turns off the second transistor, reciprocally turns on and off the third and fourth transistors, and reciprocally turns on and off the fifth and sixth transistors. Further, responsive to the control signal indicative of the absolute value of the input signal being greater than the threshold, the controller reciprocally turns on and off the first and second transistors while, responsive to the magnitude of the input voltage being positive, turns on the third and sixth transistors and turns off the fourth and fifth transistors and, responsive to the magnitude of the input voltage being negative, the controller turns on the fifth and fourth transistors and turns off the third and sixth transistors.

In yet another embodiment, an amplifier includes a first voltage source node and a second voltage node. The amplifier also includes a voltage source switch network operable to switch either a voltage from the first voltage source node or the boost voltage node to an intermediate node. The amplifier further includes a second switch network coupled to the intermediate node and operable to switch a voltage on the intermediate node or a common voltage to an output node of the amplifier. A controller is included and, responsive to a control signal indicative of an input signal to be amplified being lower than a threshold, the controller asserts control signals to switch the voltage from the first voltage source node to the intermediate node and assert control signals to the second switch network to toggle an output voltage on the output node between the common voltage and the voltage on the intermediate node. Responsive to the control signal indicative of the absolute value of the input signal being greater than the threshold, controller asserts control signals to the voltage source switch network to reciprocally switch the voltages from the first source voltage node and from the second voltage node to the intermediate node and asserts control signals to the second switch network to toggle an output voltage on the output node between the voltage from the first voltage source node and the voltage from the second voltage node.

BRIEF DESCRIPTION OF THE DRAWINGS

For a detailed description of various examples, reference will now be made to the accompanying drawings in which.

DETAILED DESCRIPTION

In the disclosed embodiments, an output stage of a class D amplifier includes multiple transistors coupled together in a configuration that permits the use of a boost converter (or other suitable circuit) for higher amplitude input signals to be amplified, however, for lower amplitude input signals, the boost converter is not used. In one illustrative embodiment, the transistors include a first transistor coupled to a first voltage source node and a second transistor coupled to a second voltage source node. The first and second transistors also couple together at an intermediate node. A third transistor couples to the intermediate node. A fourth transistor is coupled to the third transistor at a positive output node of the amplifier. A fifth transistor is coupled to the intermediate node, and a sixth transistor is coupled to the fifth transistor at a negative output node of the amplifier. In some implementations, some or all of the transistors comprise n-type laterally diffused metal oxide semiconductor field effect (LDMOS) transistors.

A boost converter also is included as part of, or coupled to, the amplifier, to convert a first voltage (e.g., a battery voltage) of the first voltage source node to a second voltage for the second voltage source node. The second voltage from the boost converter is greater than the first voltage. Responsive to a magnitude of an input signal to be amplified being within a first voltage range (e.g., at the lower amplitude level not requiring the boost converter), a controller, coupled to or included within the amplifier, generates a control signal to keep the second transistor in an off state, generates control signals to reciprocally toggle on and off the third and fourth transistors, and generates control signals to reciprocally toggle on and off the fifth and sixth transistors. In this embodiment, the third and sixth transistors are on at the same time and the fourth and the fifth transistors are on at the same time.

Responsive to the magnitude of the input signal being outside the first voltage range (e.g., at a magnitude requiring the boost converter), the controller generates control signals to reciprocally toggle on and off the first and second transistors and responsive to the magnitude of the input voltage being positive, generate control signals to turn on the third and sixth transistors and turn off the fourth and fifth transistors. Responsive to the magnitude of the input voltage being negative, the controller generates control signals to turn on the fifth and fourth transistors and turn off the third and sixth transistors.

Figure 1:
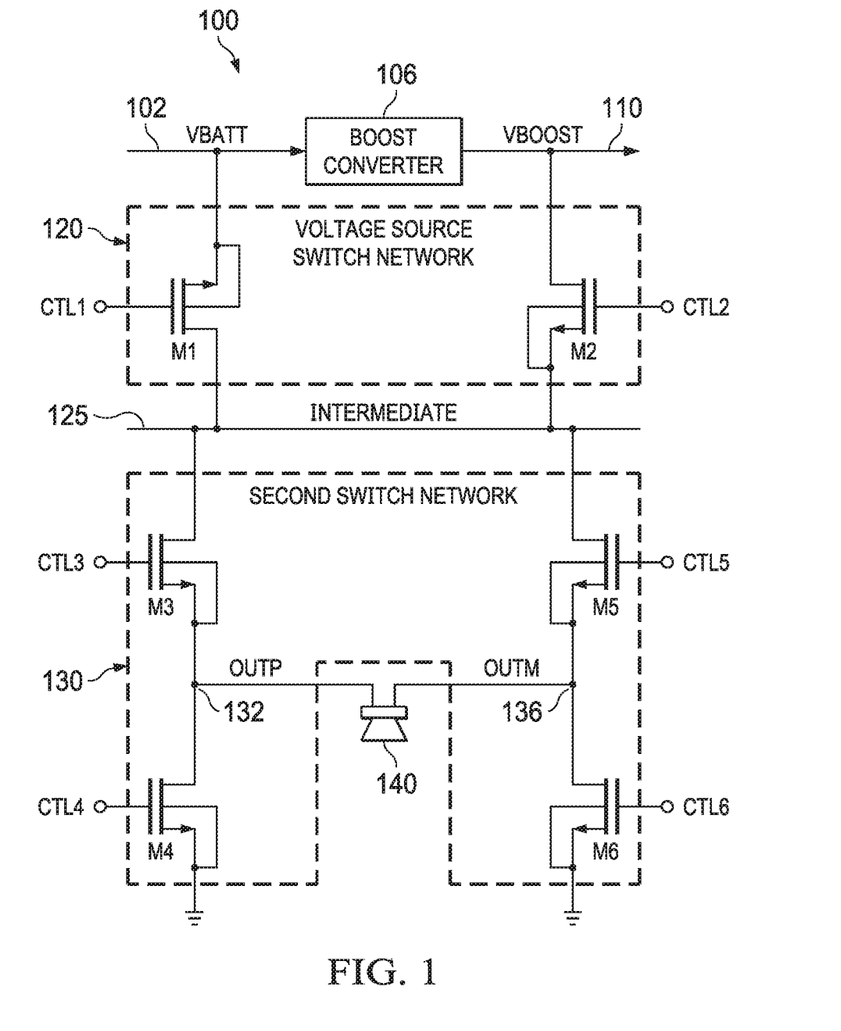
FIG. 1 illustrates an output stage of an amplifier in accordance with an embodiment.

FIG. 1 illustrates an output stage 100 of an amplifier in accordance with an embodiment. Additional components may be included as well as part of the amplifier, at least some of which are illustrated in other figures and discussed below. In the example of FIG. 1, the output stage 100 includes a voltage source switch network 120 and a second switch network 130. The voltage source switch network 120 is coupled to a first voltage source node 102 and to a second voltage source node 110. The first voltage source node 102 may be coupled to a voltage source (not shown) and thus the voltage on the first voltage source node 102 may be the voltage of that particular voltage source. In one application, the voltage source is a battery, although the voltage source can be other than a battery in other embodiments. The first voltage source node 102 is labeled as "VBATT" to illustrate the example in which the voltage source is a battery. The first voltage source node 102 is referred to herein as the "VBATT node".

A boost converter 106 also is illustrated in FIG. 1. The boost converter 106 may be part of, or separate from, the amplifier's output stage 100. The boost converter 106 receives the voltage from the VBATT node 102 and generates an output voltage that is greater than the voltage on the VBATT node. The output voltage from the boost converter 106 is provided to the second voltage source node 110, which is labeled "VBOOST" and may be referred to herein as the "VBOOST node". In other embodiments, the voltage on the second voltage source node 110 may be from a circuit other than the boost converter. For example, a second power supply may supply the elevated voltage for the second voltage source node 110. In another example, the system may have one supply voltage and one or more direct current (DC)-to-DC converters (e.g., buck converters) to generate the voltage from the nodes 102, 110.

The voltage source switch network 120 in the example of FIG. 1 includes a pair of transistors M1 and M2. The source of M1 connects to the VBATT node 102 and the drain of M2 connects to the VBOOST node 110. The drain of M1 and the source of M2 are connected together at a node 125 designated as the intermediate node. In another example, the source and drain terminals of M1 may be reversed. Each of M1 and M2 is controlled by respective control signals shown in FIG. 1 as CTL1 (for M1) and CTL2 (for M2). Each control signal can turn on the respective transistor to thereby switch the corresponding node voltage to the intermediate node. For example, M1 can be turned on to switch the voltage on the VBATT node 102 to the intermediate node 120. Similarly, M2 can be turned on to switch the voltage on the VBOOST node 110 to the intermediate node 120. In general, only one of the switches M1 and M2 are on at the same time and thus the voltage on the intermediate node 125 is either VBATT or VBOOST (i.e., the voltage on the VBATT node 102 or the VBOOST node 110.

Referring still to the example of FIG. 1, the second switch network 130 comprises four transistors shown as M3, M4, M5, and M6. The drains of M3 and M5 connect to the intermediate node 130. The source of M3 connects to the drain of M4, and the source of M4 connects to a common potential (e.g., ground). The node connecting M3 to M4 is identified as node 132 and represents the positive output node (OUTP) of the amplifier. The source of M5 connects to the drain of M6, and the source of M6 connects to the common potential (e.g., ground). The node connecting M5 to M6 is identified as node 136 and represents the negative (minus) output node (OUTM) of the amplifier. A speaker 140 is shown connected to the positive and negative output nodes of the amplifier.

Each of transistors M3-M6 are controlled by a respective control signal. Transistor M3 is controlled by control signal CTL3. Transistor M4 is controlled by control signal CTL4. Transistor M5 is controlled by control signal CTL5. Transistor M6 is controlled by control signal CTL6. The use of the control signals CTL1-CTL6 is explained below.

In some embodiments, at least one of the transistors M1-M6 is a laterally diffused metal oxide semiconductor field effect transistor (LDMOS). In some implementations, all of the transistors M1-M6 are LDMOS transistors. In the example of FIG. 1, transistors M1-M6 are n-type LDMOS transistors. The bulk (sometimes called "back gate") connection of each transistor is shown in the example of FIG. 1 as connected to the source of the respective transistor. Switches and control logic to dynamically connect the bulk of each transistor to different potentials and nodes need not be included.

In operation, the transistors M1-M6 of the output stage 100 are controlled in multiple different modes of operation depending on the magnitude of the input signal to be amplified. For example, a lower power mode of operation is used when the input signal is less than a threshold level and higher power mode of operation is used when the input signal is greater than the threshold level. Each of these operational modes is explained below.

Figure 2:
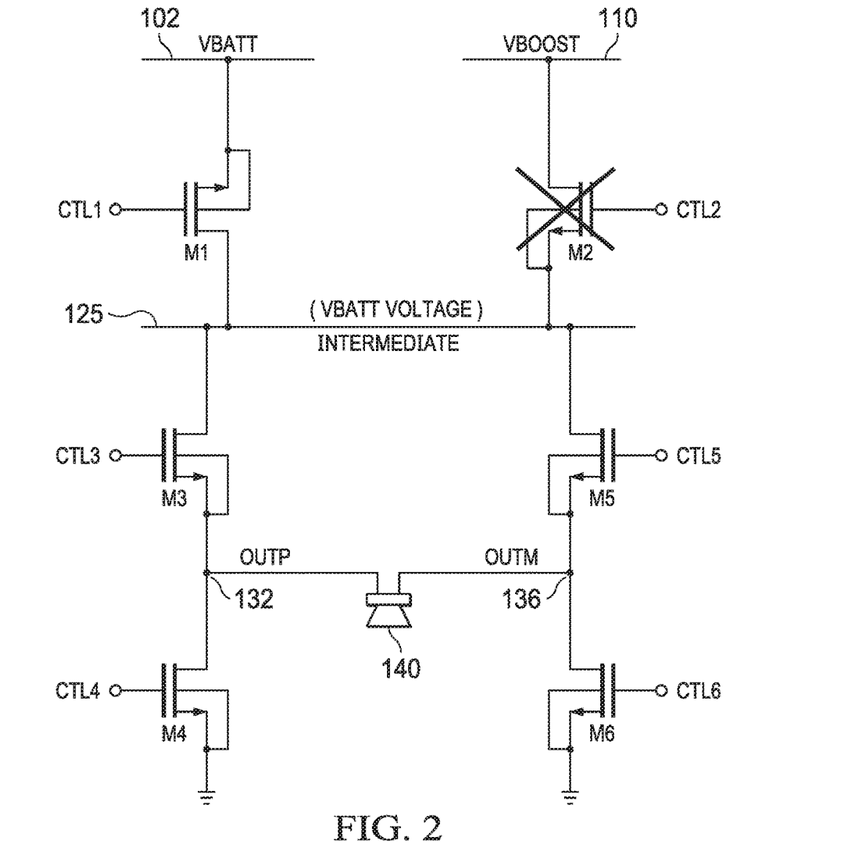
FIG. 2 illustrates operation of the output stage for a lower power mode of operation in accordance with an embodiment.
Figure 3:
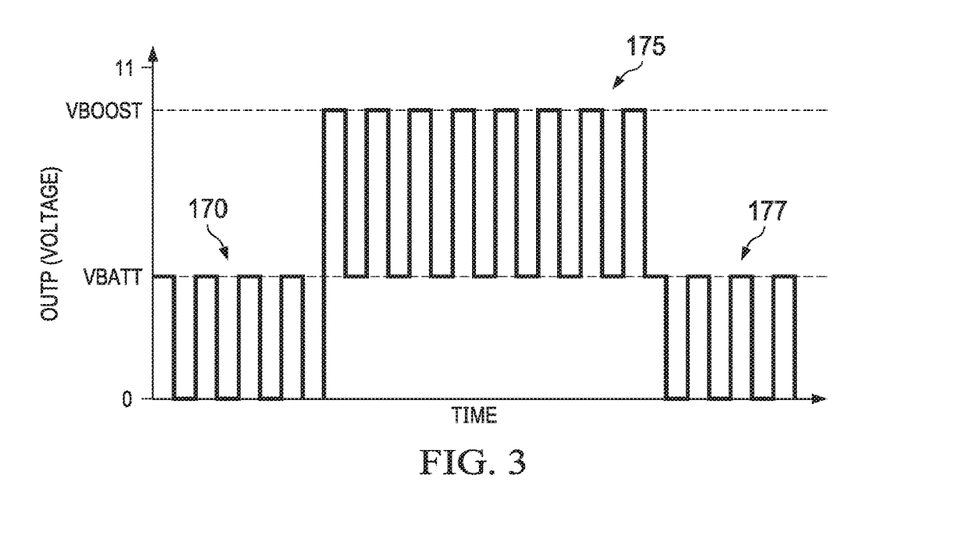
FIG. 3 shows a waveform of an amplifier output node during both lower and higher modes of operation.

FIG. 2 illustrates the lower power mode of operation. For this mode (input signal is less than a threshold), the voltage from the boost converter 106 is not needed. Control logic (shown in other figures) controls the state of control signal CTL1 to maintain M1 in an on state and, as indicated by the "X" through M3, and controls the state of control signal CTL2 to maintain M2 in an off state. As such, the VBATT voltage, and not VBOOST, is switched through M1 on to the intermediate node. The control logic also generates control signals CTL3 and CTL4 to reciprocally toggle on and off M3 and M4 and control signals CTL5 and CTL6 to reciprocally toggle M5 and M6 on and off. Transistor pairs M3/M4 and M5/M6 reciprocally turn on an off but 180 degrees out of phase with respect to each other. For example, in one state M3 and M6 are on at the same time (and thus M4 and M5 are off), and in another state M4 and M5 are on at the same time (and thus M3 and M6 are off). M3 and M4 are not turned on at the same time. Similarly, M5 and M6 are not turned on at the same time. Because M1 is on (thereby forcing the intermediate node voltage to be VBATT) and M3 and M4 are reciprocally turned on an off, the voltage on the positive output voltage node, OUTP, toggles between VBATT and ground as shown at 170 in FIG. 3. FIG. 3 shows a waveform depicting the OUTP voltage with respect to ground. The output node of the amplifier comprises the nodes 132 and 136 and thus is a differential output. Because the OUTM voltage also is toggling between VBATT, with respect to OUTM, the OUTP voltage toggles between +VBATT and −VBATT. Some implementations may include a current recycling phase where both OUTM and OUTP are at the same voltage potential by having M4 and M6 (or M3 and M5) on at the same time. During this phase, current is recycled through the transistor switches that are on.

Referring again to FIG. 1, when the absolute value of the magnitude of the input signal to be amplified is greater than a threshold level, the control logic controls the states of CTL1-CTL6 to control the corresponding transistors in a way to include the use of the higher voltage source that may be provided by boost converter 106, or other suitable circuit as noted above. In one example, the control logic controls the state of the CTL1 and CTL2 control signals to reciprocally turn M1 and M2 on and off. When M1 is on (and thus M2 is off), the VBATT voltage is switched on to the intermediate node 125, and when M2 is on (and thus M1 is off), the VBOOST voltage is switched on to the intermediate node. The control logic controls the duty cycle of switching M1 and M2 on and off to control the average voltage on the intermediate node 125. The average voltage is greater than VBATT and generally less than VBOOST, although if desired, M2 can be turned on continuously, and M1 left off, to force the voltage on the intermediate node 125 to be equal to VBOOST.

In this higher power mode of operation, responsive to the voltage level of the input signal being positive, the control logic controls the states of CTL3-CTL6 to turn on M3, turn off M4, turn off M5, and turn on M6. Responsive to the voltage level of the input signal being negative, the control logic controls the states of CTL3-CTL6 to turn on M5, turn off M6, turn off M3, and turn on M4. FIG. 3 illustrates the resulting waveform for OUTP at 175 when the input signal is positive and larger than the threshold as noted above. The OUTP waveform at 177 illustrates the OUTP voltage as the magnitude of the input signal falls below the threshold and the lower power mode of operation is again implemented by the control logic.

Figure 4:
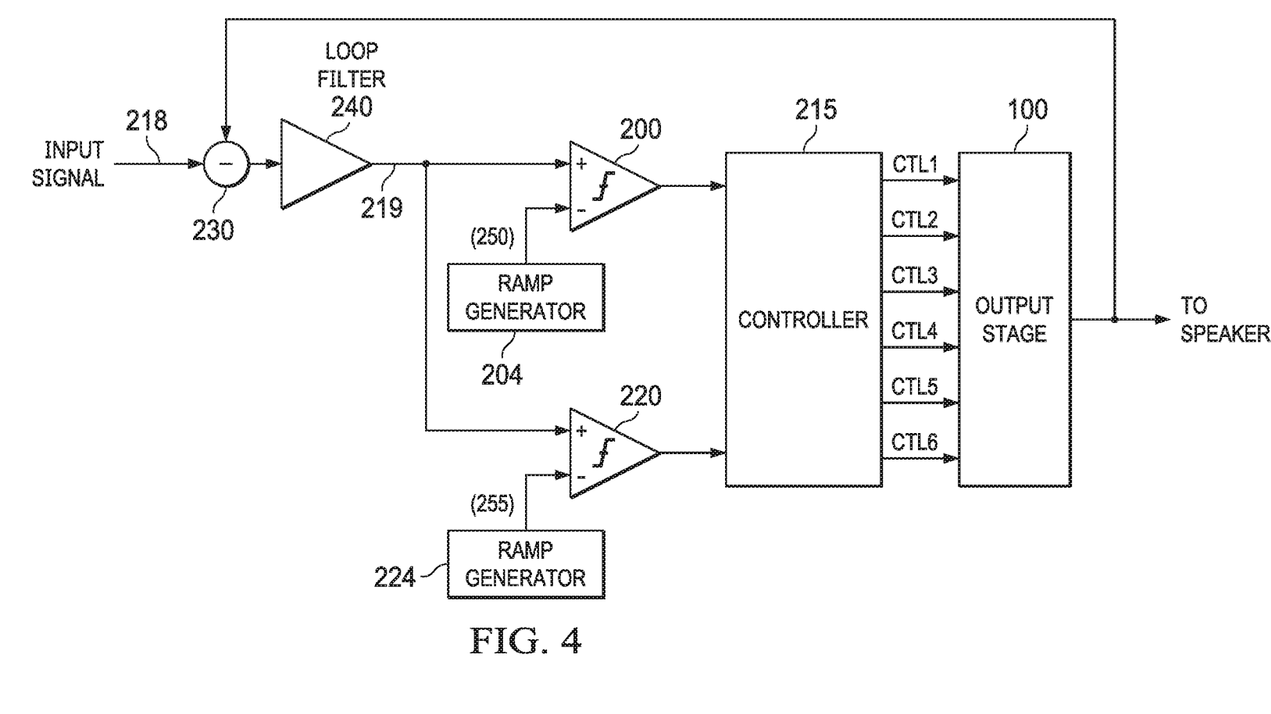
FIG. 4 shows an embodiment of the amplifier including the output stage and multiple ramp generators.

FIG. 4 illustrates an example of an amplifier including the output stage 100 described above. The amplifier in this example includes a subtractor 230, a loop filter 240, comparators 200 and 220, ramp generators 204 and 224, and a controller 215. An input signal 218 to be amplified is provided to the subtractor 230, and the difference signal is then filtered by loop filter 240, which may comprise a fourth-order filter, to produce a filtered input signal 219. The control logic noted above may include the controller 215 and/or other components shown in FIG. 4. Each ramp generator 204, 224 generates a triangular voltage waveform that is compared to the filtered input signal 219 of the loop filter 240 by comparators 200 and 220 to generate pulse width modulated signals to be provided to the controller 215. The controller 215 generates the control signals CTL1-CTL6 discussed above that are provided to the gates of M1-M6 in the output stage 100. The output signal generated by the stage 100 (e.g., OUTP-OUTM) is provided to the speaker and also is a feedback signal to the subtractor 230.

Figure 5:
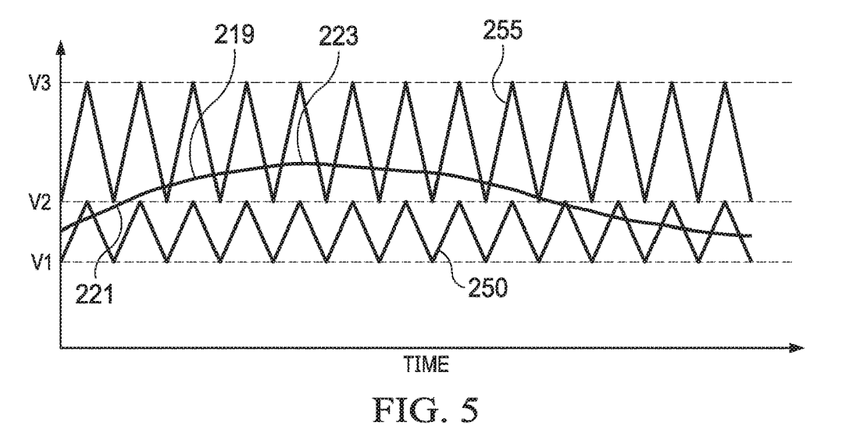
FIG. 5 shows waveforms characteristic of the embodiment of FIG. 4.

FIG. 5 illustrates an example of the triangular voltage waveforms generated by the ramp generators 204, 224. Triangular waveform 250 may be generated by ramp generator 204 and triangular waveform 255 may be generated by ramp generator 224. Triangular waveform 250 has a minimum voltage of V1 and a maximum voltage of V2. Triangular waveform 255 has a minimum voltage of V2 and a maximum voltage of V3. The voltage difference between V2 and V1 and the voltage difference between V3 and V2 (referred to as the peak-to-peak voltage for the ramps) may be selected such that these voltage differences are in same ratio as the difference between VBATT and ground for the first ramp (waveform 250) and the difference between VBOOST and VBATT for the second ramp (waveform 255) to keep the overall relationship from the input to the comparators to the output of the final output stage a constant value. The triangular waveforms 250 and 255 may have different peak-to-peak magnitudes and also have different common mode levels as shown.

A portion of the filtered input signal 219 is shown superimposed on the sawtooth waveforms 250, 255. Voltage V2 (maximum of triangular waveform 250 and minimum of triangular waveform 255) generally represents the threshold voltage for determining whether the controller 215 is to operate the output stage 100 in the lower power mode of operation or the higher power mode of operation noted above.

When the magnitude of the filtered input signal 219 is below V2, for example as identified at 221, the output of comparator 200 is a pulse width modulated signal that is a logic high when the filtered input signal 219 exceeds the voltage level of the triangular waveform 221, and a logic low otherwise. While the magnitude of the filtered input signal 219 is less than V2, the output of comparator 220 is a continuous logic low as the voltage level of triangular waveform 255 is continuously higher than filtered input signal 219. Thus, when the filtered input signal is less than V2, the output of comparator 200 is a time varying square wave with a particular duty cycle, and the output of comparator 220 is a constant value (e.g., low).

When the magnitude of the filtered input signal 219 is above V2, for example as identified at 223, the output of comparator 220 is a pulse width modulated signal that is a logic high when filtered input signal 219 exceeds the voltage level of the triangular waveform 223, and a logic low otherwise. While the magnitude of the filtered input signal 219 is greater than V2, the output of comparator 200 is constant (e.g., high) as the filtered input signal 219 is continuously greater than voltage level of triangular waveform 250. Thus, when the filtered input signal is greater than V2, the output of comparator 220 is a time varying square wave with a particular duty cycle, and the output of comparator 200 is a constant value (e.g., high).

The controller 215 uses the output signals from the comparators to determine whether the output stage 100 should be operated in the higher power mode of operation to use the voltage from the boost converter 106 (or other type of higher voltage source), or in the lower power mode of operation without use of the voltage from the boost converter. If the output of comparator 200 is a time varying signal and the output of comparator 220 is constant (e.g., low), then the controller 215 operates the output stage in the lower power mode of operation. If the output of comparator 220 is a time varying signal and the output of comparator 200 is constant (e.g., high), then the controller 215 operates the output stage in the higher power mode of operation.

Figure 6:
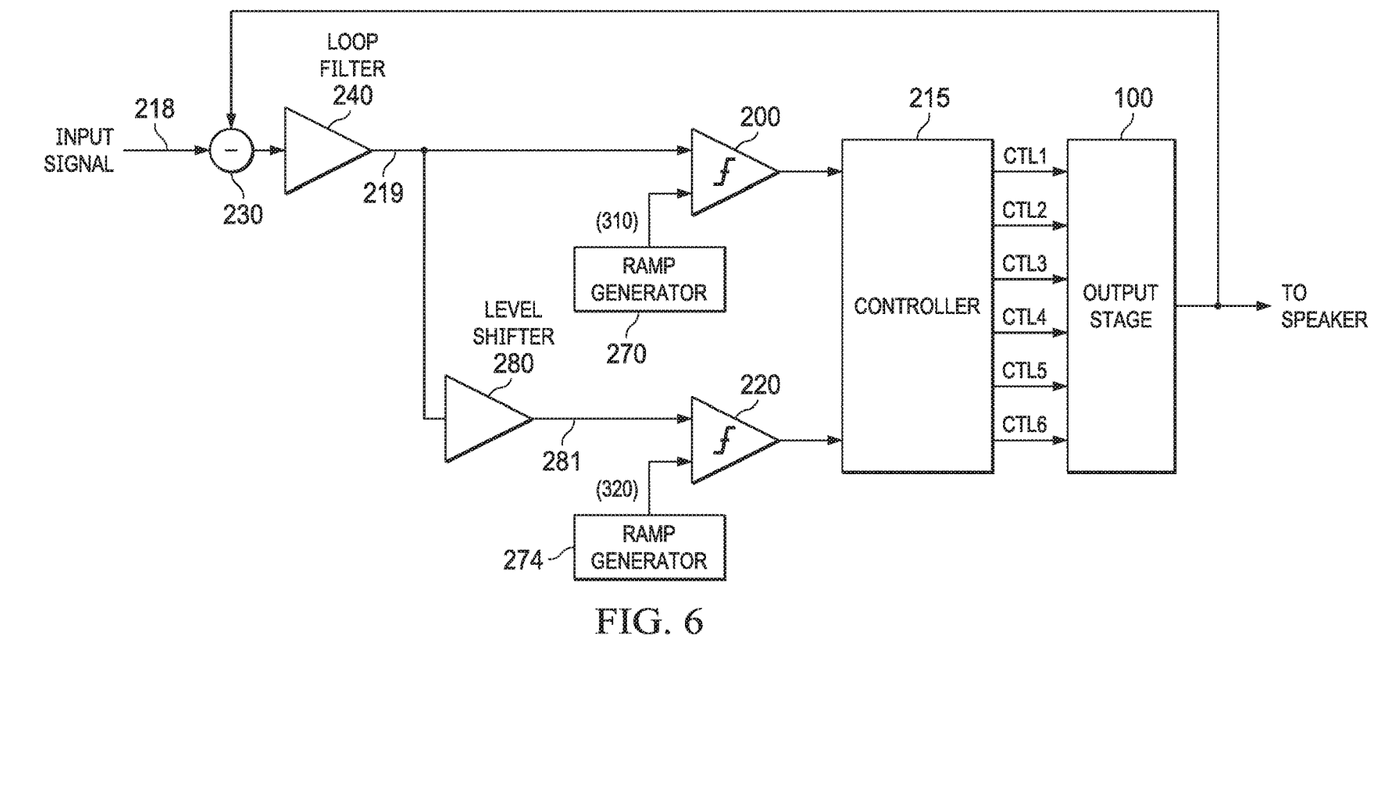
FIG. 6 shows another embodiment of the amplifier including the output stage and multiple ramp generators.
Figure 7:
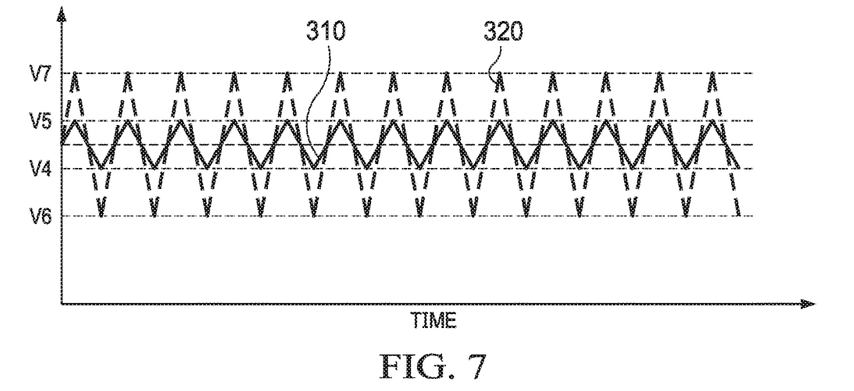
FIGS. 7 and 8 show waveforms characteristic of the embodiment of FIG. 6.

FIGS. 6 and 7 illustrate another embodiment of the amplifier. As in the example of FIG. 4, the amplifier of FIG. 6 includes the subtractor 230, the loop filter 240, comparators 200, 220, controller 215 and the output stage 100. The amplifier in FIG. 6 includes ramp generators 270 and 274 and a level shifter 280. The ramp generators 270, 274 generate the triangular waveforms 310 and 320 depicted in FIG. 7. Triangular waveform 310 may be generated by ramp generator 270, and triangular waveform 320 may be generated by ramp generator 274. As illustrated in FIG. 7, the two triangular waveforms have different peak-to-peak magnitudes, but the same common mode level. The peak-to-peak voltage difference of the triangular waveform 310 (V5-V4) and of the triangular waveform 320 (V7-V6) may be selected as described above. That is, the voltage difference between V5 and V4 and the voltage difference between V7 and V6 (referred to as the peak-to-peak voltage for the ramps) may be selected such that these voltage differences are in same ratio as the difference between VBATT and ground for the first ramp (waveform 310) and the difference between VBOOST and VBATT for the second ramp (waveform 320) to keep the overall relationship from the input to the comparators to the output of the final output stage a constant value.

Figure 8:
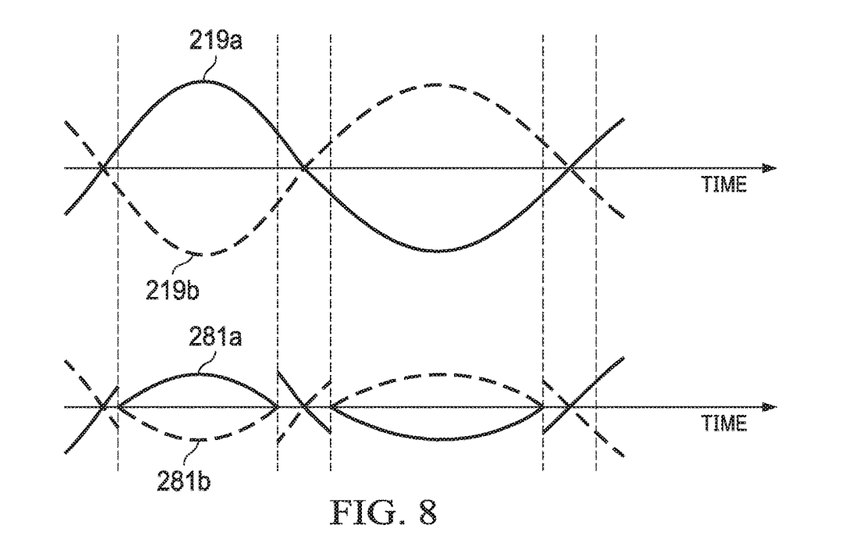

Because the triangular waveforms have the same common mode level, the filtered input signal 219 in this example is level shifted by level shifter 280 to generate a level-shifted signal 281 to the comparator 220 to compare against the respective triangular waveform 320. FIG. 8 shows the differential input signal 219 as waveforms 219a and complementary waveform 291b and the level shifted signal 281 as level shifted waveform 281a and complementary level shifted waveform 281b. The positive half of signal 281 is level shifted with a negative DC voltage, and the negative half of signal 281 is level shifted with a positive DC voltage. The amount of the shift is such that the average differential pulse width modulation (PWM) signal generated by comparator 220, comparing input signal 281 with ramp signal 320 is approximately zero, at the same point as when the differential PWM signal generated by comparator 200, comparing input signal 219 with ramp signal 310 is almost 100%. This ensures that the transition from the low mode of power switching to the high mode of switching is distortion free.

When the differential value of the magnitude of the input signal 219 is less than V2 minus V1, the controller 215 asserts the control signals to the output stage to cause OUTP(M) to switch between 0 and VBATT as explained above. When the differential value of the magnitude of the input signal 219 is greater than V2-V1, the controller 215 asserts the control signals to the output stage to cause OUTP(M) to switch between VBATT and VBOOST.

The controller 215 is signaled on the polarity of the signal 219 or 281 by either of the comparators 220 or 200 (or by any other logic in the system) to select between the M5 and M4 switches to be on and M3 and M6 switches to be off for a negative signal, and M3 and M6 switches to be on and M5 and M4 switches to be off for a positive signal during the high power switching mode.

Because in some embodiments, the transistors M1-M6 comprise n-type LDMOS transistors with no bulk switching (i.e., back gates are connected to sources of the transistors as illustrated in FIGS. 1 and 2), the resulting amplifier occupies less area and has greater efficiency than would be the case if n-type LDMOS transistors and bulk switching were used.

Although three-level switching is described above between 0, VBATT, and VBOOST, the disclosed techniques can be extended to n-level shifting, where n greater than 3.

Certain terms are used throughout the above description and claims to refer to particular system components. As one skilled in the art will appreciate, different parties may refer to a component by different names. This document does not intend to distinguish between components that differ in name but not function. In the above discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplifier, comprising:
a first transistor coupled to a first voltage source node;
a second transistor coupled to a second voltage source node, wherein the first and second transistors also couple together at an intermediate node;
a third transistor coupled to the intermediate node;
a fourth transistor coupled to the third transistor at a positive output node of the amplifier;
a fifth transistor coupled to the intermediate node; and
a sixth transistor coupled to the fifth transistor at a negative output node of the amplifier;
further comprising a boost converter configured to convert a first voltage of the first voltage source node to a second voltage for the second voltage source node, wherein the second voltage is greater than the first voltage.

2. An amplifier, comprising:
a first transistor coupled to a first voltage source node;
a second transistor coupled to a second voltage source node, wherein the first and second transistors also couple together at an intermediate node;
a third transistor coupled to the intermediate node;
a fourth transistor coupled to the third transistor at a positive output node of the amplifier;
a fifth transistor coupled to the intermediate node; and
a sixth transistor coupled to the fifth transistor at a negative output node of the amplifier;
further comprising a controller configured to, responsive to a magnitude of an input signal to be amplified being within a first voltage range:
generate a control signal to turn on the first transistor;
generate a control signal to keep the second transistor in an off state;
generate control signals to reciprocally toggle on and off the third and fourth transistors; and
generate control signals to reciprocally toggle on and off the fifth and sixth transistors;

wherein the third and sixth transistors are on at the same time and wherein the fourth and the fifth transistors are on at the same time.

3. The amplifier of claim 2, wherein, responsive to the magnitude of the input signal being outside the first voltage range, the controller is configured to:
generate control signals to reciprocally toggle on and off the first and second transistors;
responsive to the magnitude of the input voltage being positive, generate control signals to turn on the third and sixth transistors and turn off the fourth and fifth transistors; and
responsive to the magnitude of the input voltage being negative, generate control signals to turn on the fifth and fourth transistors and turn off the third and sixth transistors.

4. The amplifier of claim 3, further comprising:
a first comparator to compare a first ramp signal to the input signal;
a second comparator to compare a second ramp signal to the input signal, wherein the first and second ramp signals have different peak-to-peak magnitudes but the same common mode level; and
a level shifter coupled to an input of the second comparator, wherein the level shifter is configured to subtract the common mode of the input signal from the input signal to produce a level shifted input signal and to provide the level shifted input signal to the input of the second comparator.

5. An amplifier, comprising:
a first transistor coupled to a first voltage source node;
a second transistor coupled to a second voltage source node, wherein the first and second transistors also couple together at an intermediate node;
a third transistor coupled to the intermediate node;
a fourth transistor coupled to the third transistor at a positive output node of the amplifier;
a fifth transistor coupled to the intermediate node; and
a sixth transistor coupled to the fifth transistor at a negative output node of the amplifier;
further comprising a controller configured to, responsive to a magnitude of an input signal to be amplified being outside a first voltage range:
generate control signals to reciprocally toggle on and off the first and second transistors;
responsive to the magnitude of the input voltage being positive, generate control signals to turn on the third and sixth transistors and turn off the fourth and fifth transistors; and
responsive to the magnitude of the input voltage being negative, generate control signals to turn on the fifth and fourth transistors and turn off the third and sixth transistors.

6. An amplifier, comprising:
a first transistor coupled to a first voltage source node;
a boost converter configured to convert a first voltage from the first voltage source node to a higher second voltage of a second voltage source node;
a second transistor coupled to the second voltage source node, wherein the first and second transistors also couple together at an intermediate node;
a third transistor coupled to the intermediate node;
a fourth transistor coupled to the third transistor at a positive output node of the amplifier;
a fifth transistor coupled to the intermediate node;
a sixth transistor coupled to the fifth transistor at a negative output node of the amplifier; and a controller configured to:
responsive to a control signal indicative of an input signal to be amplified being lower than a threshold, turn on the first transistor, turn off the second transistor, reciprocally turn on and off the third and fourth transistors, and reciprocally turn on and off the fifth and sixth transistors; and
responsive to the control signal indicative of the input signal being greater than the threshold, reciprocally turn on and off the first and second transistors, responsive to the magnitude of the input voltage being positive turn on the third and sixth transistors and turn off the fourth and fifth transistors, and responsive to the magnitude of the input voltage being negative turn on the fifth and fourth transistors and turn off the third and sixth transistors.

7. The amplifier of claim 6, wherein at least one of the first, second, third, fourth, fifth, and sixth transistors comprise laterally diffused metal oxide semiconductor field effect transistors.

8. The amplifier of claim 6, wherein the first, second, third, fourth, fifth, and sixth transistors comprise laterally diffused metal oxide semiconductor field effect transistors.

9. The amplifier of claim 6, wherein the first, second, third, fourth, fifth, and sixth transistors comprise n-type laterally diffused metal oxide semiconductor field effect transistors.

10. The amplifier of claim 6, further comprising:
a first comparator to compare a first ramp signal to the input signal;
a second comparator to compare a second ramp signal to the input signal, wherein the first and second ramp signals have different peak-to-peak magnitudes but the same common mode level; and
a level shifter coupled to an input of the second comparator, wherein the level shifter is configured to subtract the common mode of the input signal from the input signal to produce a level shifted input signal and to provide the level shifted input signal to the input of the second comparator.

11. The amplifier of claim 6, further comprising:
a first comparator to compare a first ramp signal to the input signal; and
a second comparator to compare a second ramp signal to the input signal, wherein the first and second ramp signals have different peak-to-peak magnitudes and different common mode signal levels.

12. The amplifier of claim 6, wherein the amplifier is an audio amplifier and the first voltage is a battery voltage.

13. An amplifier, comprising:
a first voltage source node;
a second voltage node;
a voltage source switch network operable to switch either a voltage from the first voltage source node or the second voltage node to an intermediate node;
a second switch network coupled to the intermediate node and operable to switch a voltage on the intermediate node or a common voltage to an output node of the amplifier; and
a controller configured to:
responsive to a control signal indicative of an input signal to be amplified being lower than a threshold, assert control signals to switch the voltage from the first voltage source node to the intermediate node, and assert control signals to the second switch network to toggle an output voltage on the output node between the common voltage and the voltage on the intermediate node; and responsive to the control signal indicative of the input signal being greater than the threshold, assert control signals to the voltage source switch network to reciprocally switch the voltages from the first source voltage node and from the second voltage node to the intermediate node and assert control signals to the second switch network to toggle an output voltage on the output node between the voltage from the first voltage source node and the voltage from the second voltage node.

14. The amplifier of claim 13, wherein the voltage source switch network comprises a first transistor coupled between the first voltage source node and the intermediate node and a second transistor coupled between the second voltage node and the intermediate node.

15. The amplifier of claim 14, wherein each of the first and second transistors have a back gate connection and a source connection, and wherein the back gate connection of each transistor is connected to that transistor's source connection.

16. The amplifier of claim 13, wherein the second switch network comprises:
   a first transistor coupled to the intermediate node;
   a second transistor coupled to the first transistor at a positive output node of the amplifier;
   a third transistor coupled to the intermediate node; and
   a fourth transistor coupled to the third transistor at a negative output node of the amplifier.

* * * * *